United States Patent [19]
Pennings et al.

[11] 4,172,544
[45] Oct. 30, 1979

[54] WIRE TENSIONING AND FEEDING DEVICE

[75] Inventors: Matheus D. Pennings, Los Altos Hills; Billy B. Tippin, Saratoga, both of Calif.

[73] Assignee: Sola Basic Industries, Inc., Milwaukee, Wis.

[21] Appl. No.: 907,955

[22] Filed: May 22, 1978

Related U.S. Application Data

[62] Division of Ser. No. 797,622, May 17, 1977, Pat. No. 4,109,846.

[51] Int. Cl.² ........................................... B65H 17/32
[52] U.S. Cl. ...................................... 226/97; 226/195
[58] Field of Search ............................ 226/91, 97, 195

[56] References Cited
U.S. PATENT DOCUMENTS

| | | | |
|---|---|---|---|
| 2,302,790 | 11/1942 | Modigliani | 226/97 X |
| 3,319,859 | 5/1967 | Miller | 226/91 |
| 3,669,328 | 6/1972 | Castelli | 226/195 X |

*Primary Examiner*—Richard A. Schacher
*Attorney, Agent, or Firm*—Blakely, Sokoloff, Taylor & Zafman

[57] ABSTRACT

A self-threading and tensioning device for use with a semiconductor bonder, or the like, is disclosed. A first pneumatic stream is used to obtain the self-threading of the thin (e.g. 1 mil.) bonding wire. A second pneumatic stream provides the tensioning of the wire during the bonding process.

3 Claims, 9 Drawing Figures

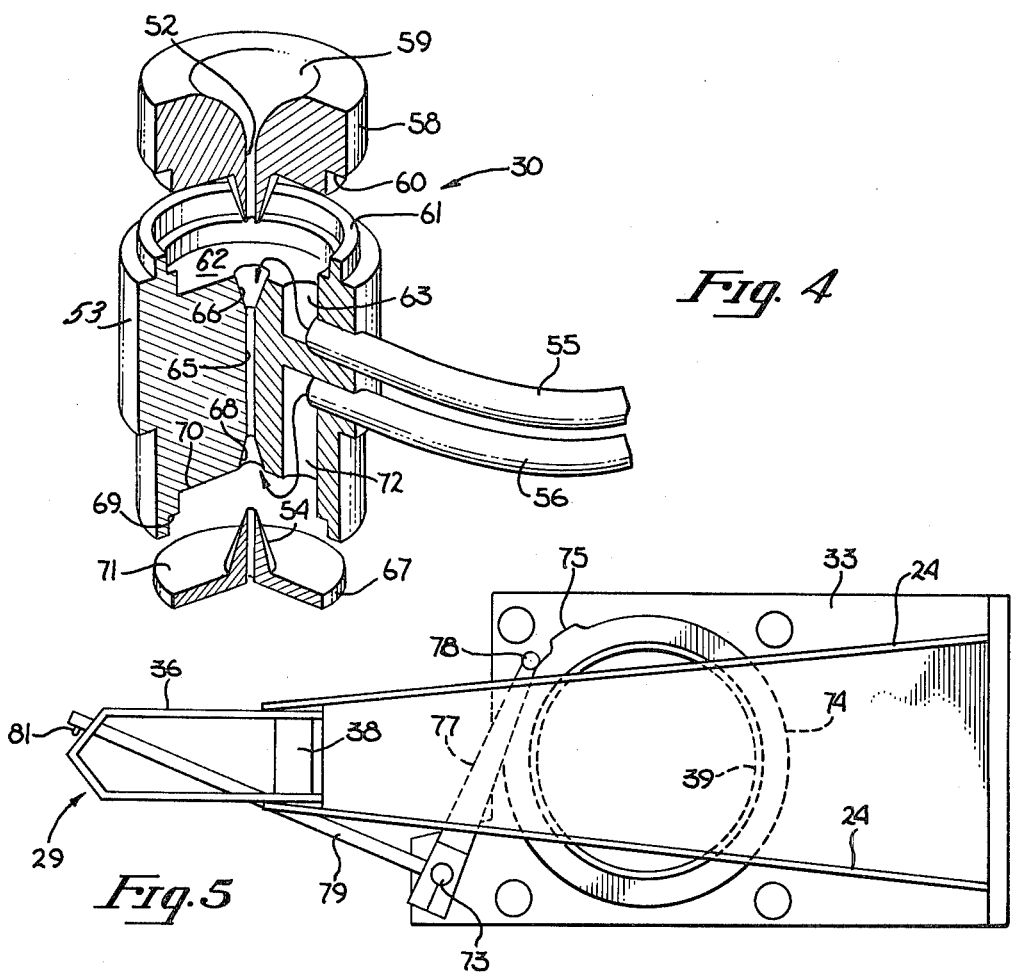
Fig. 4
Fig. 5
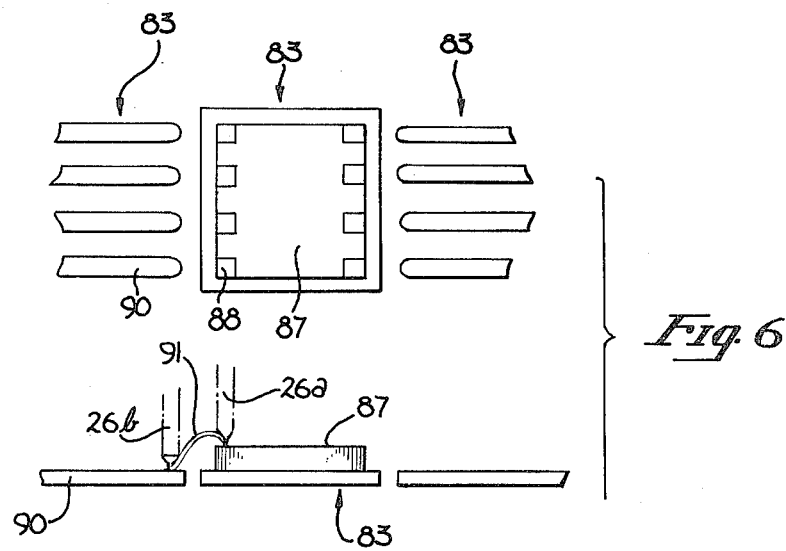
Fig. 6

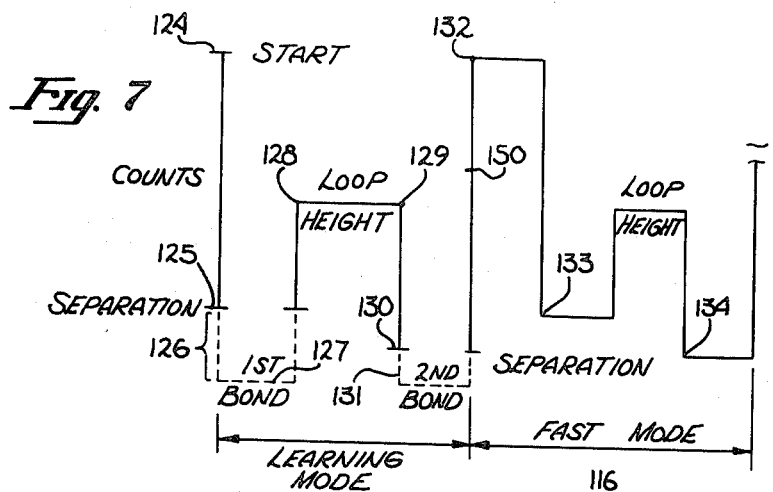
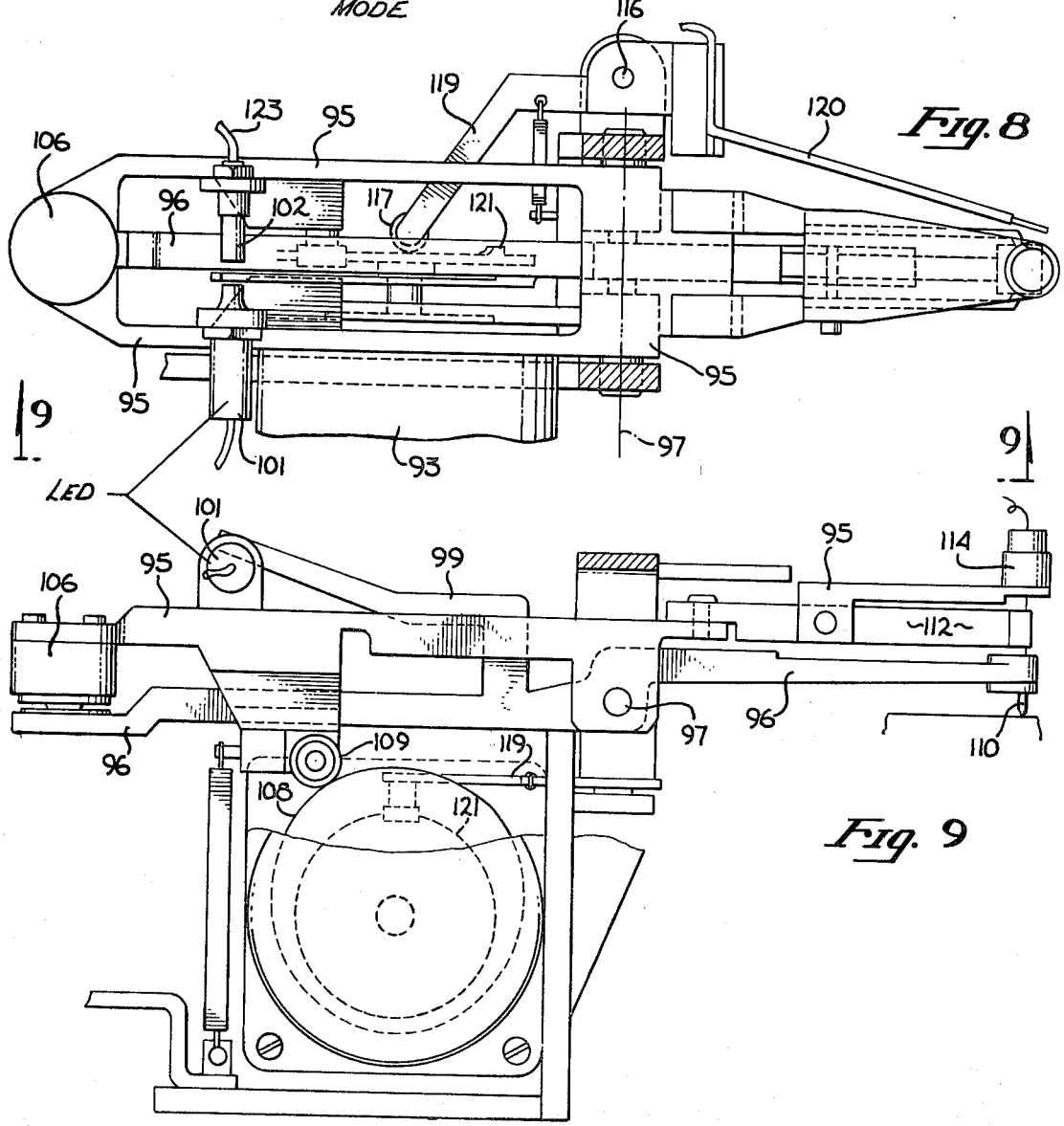

WIRE TENSIONING AND FEEDING DEVICE

This is a division of application Ser. No. 797,622, filed May 17, 1977, now U.S. Pat. No. 4,109,846.

BACKGROUND OF THE INVENTION

1. Field of the Invention

The invention relates to the field of wire tensioning and feeding devices, particularly those used on semiconductor bonders, Class 226, Subclass 97.

2. Prior Art

In the packaging of integrated circuit substrates or "chips", it is necessary to connect pads on the chips to lead frames or the like. Generally, very thin (e.g. 1 mil) gold wires are bonded to the pads and the lead frames. It is difficult to manually handle these wires and to thread them through the bonding tools.

Capillary wire feed devices are known in the art which pneumatically thread wires through capillary tools. An example of one such pneumatic threading device is described in U.S. Pat. No. 3,319,859.

Other pneumatic devices have been employed to feed and direct these thin wires. An example of a frictionless pneumatic spool mount for supporting and retaining a spool of filament wire is described in U.S. Pat. No. 3,363,818.

As will be seen, the device of the present invention provides both self-threading and tensioning. Often in the prior art the tensioning is attained with mechanical arms.

SUMMARY OF THE INVENTION

A pneumatic wire feeding and tensioning device is described. The device includes a body member having a bore. The body member defines a first cavity disposed generally about the inlet end of the bore, which cavity communicates with a first inlet port. A second cavity is disposed about the outlet end of the bore and this cavity communicates with a second inlet port. A fluid, such as air or nitrogen, is selectively fed to either the first or second ports to provide either the feeding or tensioning function.

BRIEF DESCRIPTION OF THE DRAWINGS

FIG. 4 is a cutaway view of the wire feeding and tensioning device of the present invention.

FIG. 5 is a cross-sectional, plan view of the apparatus of FIGS. 2 and 3.

FIG. 6 is an elevation and plan view of a lead frame and semiconductor die. These views are used to illustrate the difference in height between the semiconductor die and the lead frame.

DETAILED DESCRIPTION OF THE INVENTION

A device is described for feeding and tensioning a thin wire or lead. The device is particularly useful in conjunction with a semiconductor bonder, and thus is described in conjunction with an automatic semiconductor bonder.

Figure 1:
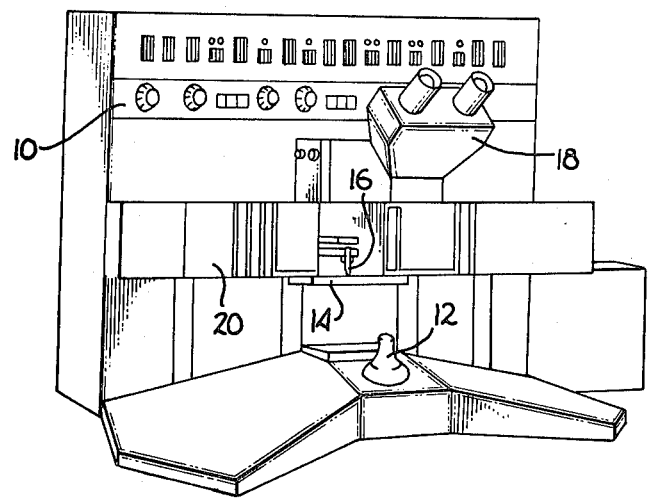
FIG. 1 is a perspective view of an automatic bonder employing the device of the present invention.

Referring to the automatic bonder illustrated in FIG. 1, this apparatus includes a control panel 10, bonding table 14, capillary 16, aligning means illustrated as microscope 18, alignment control 12, and a magazine 20. In operation lead frames which include semiconductor dies are fed from the magazine 20 onto the bonding table 14. After an initial alignment, the capillary 16 bonds leads between the semiconductor die and the fingers of the lead frame. Briefly referring to FIG. 6, a lead frame 83 is illustrated which includes a semiconductor die or "chip" 87. The capillary automatically bonds leads between the pads on the die, such as pad 88, and the fingers of the lead frame, such as finger 90. One such lead, lead 91, is illustrated in FIG. 6.

After the leads for each die are bonded, the lead frame is advanced from the magazine 20 and the next die is brought onto the bonding table 14. (See copending application Ser. No. 798,114 filed May 18, 1977 describing the magazine system employed in the presently preferred embodiment.)

After each die is moved onto the bonding table, an operator sights through the alignment microscope 18 and with use of control 12 determines the location of two of the bonding pads on the die. The automatic processor then performs a standard translational computation to determine the location of all the pads on that particular die. This information is used by the bonder to drive the apparatus shown in FIGS. 2 and 3 in the X and Y-directions. Well-known microcomputers and related circuits along with stepping motors may be employed for this purpose.

While in FIG. 1 alignment is performed with a microscope 18, it will be apparent that other alignment means may be employed. For example, a fiber optic cable may be employed to display each die on a cathode ray tube and the alignment then performed by viewing the tube, rather than sighting directly onto the die. Also the alignment may be performed automatically by employing known pattern recognition techniques.

Figure 2:
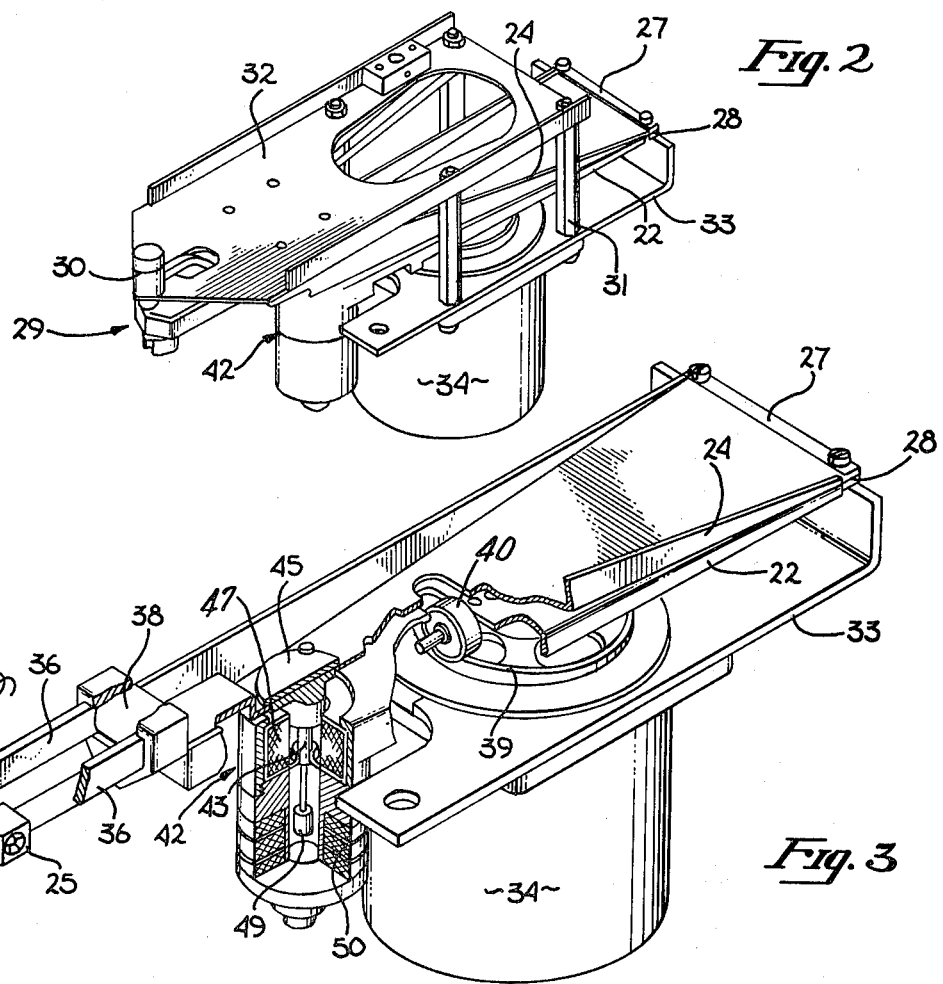
FIG. 2 is a perspective view of the height sensing apparatus used in the apparatus of FIG. 1.
Figure 3:
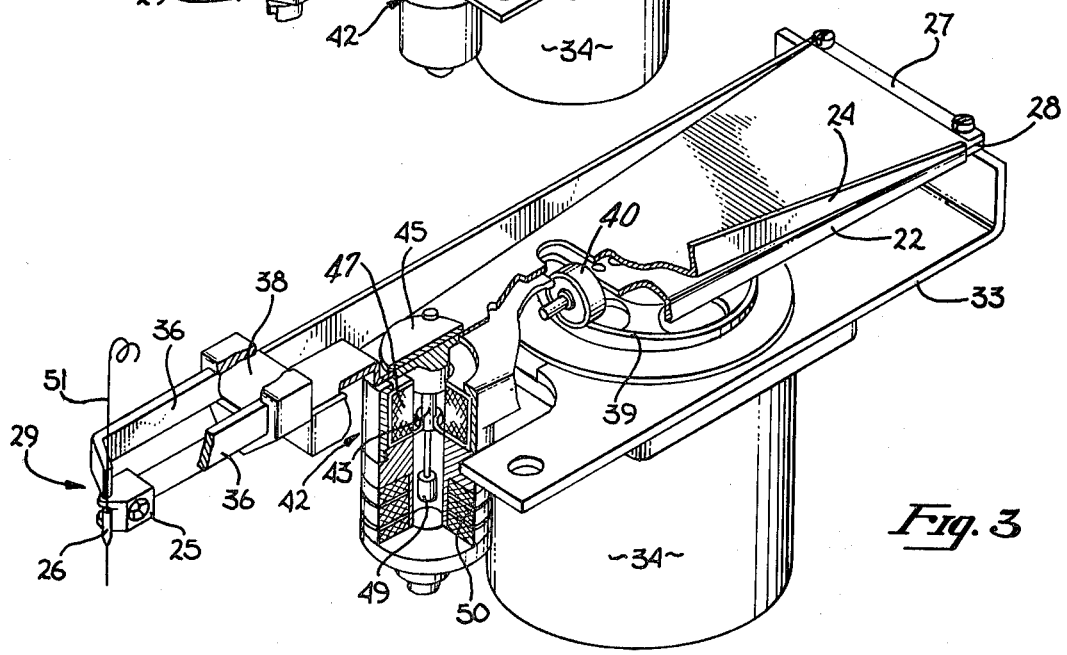
FIG. 3 is an enlarged view of the apparatus of FIG. 2 with a portion of the apparatus cutaway to reveal underlying details.

Referring now to FIGS. 2 and 3, the support 33 mounts the apparatus of these figures onto the X and Y-driving means of the bonder of FIG. 1. The apparatus of FIGS. 2 and 3, in addition to sensing height, provides the Z-drive for the capillary 26.

A generally rectangular cam following arm 22 and a capillary carrying arm 24 are pivotally mounted for movement about at axis 28 by hinge 27. These arms are urged downward by the action of a spring (not shown) which is coupled to the shaft of roller 40 (FIG. 3). Arm 24 is urged to follow arm 22 by the coupling provided by solenoid 42. The cam following arm 22 is connected to a cam following roller 40 which engages a cam 39. The cam 39 is coaxially mounted with a stepping motor 34 on the support 33. Thus as the stepping motor advance, arm 22 pivots about axis 28.

The arms 22 and 24 are interconnected through a solenoid 42. The solenoid housing is secured to arm 22 and includes the solenoid coil 47 and the windings 50 of a differential transformer. The plunger 43 of the solenoid and the slug 49 of the differential transformer are mounted on a common shaft which is coupled to the arm 24 at plate 45. The plunger 43 and slug 49 axially move within the solenoid coil 47 and the transformer winding 50, respectively.

The end of arm 24 opposite axis 28 includes a capillary mounting block 25 which receives the capillary 26. As illustrated in FIG. 3, a wire 51 is disposed through this capillary. This wire passes through a wire clamp 29 which includes jaws 36. (Note one of the jaws 36 is cutaway in FIG. 3). The jaws 36 are driven by a clamp driver 38 to permit the selective clamping of the wire 51; the clamp 29 is secured to arm 24 above the capillary 26.

As best illustrated in FIG. 2, the apparatus includes an upper frame member 32 which is rigidly coupled to support 33 through standards 31. A wire feeding and tensioning device 30 is mounted to frame 32 directly above the clamp 29. This device will be described in detail in conjunction with FIG. 4.

Referring now to FIG. 5, the capillary carrying arm 24 along with the clamp 29 are again illustrated. A torch 81 which may be a gas torch or electronic torch is mounted at the end of arm 79. Arm 79 is transversely mounted with lever 77 at pivot 73 on support 33. A roller 78 engages a cam 74, which cam is concentrically mounted with cam 39 on the stepping motor. The cam 74 includes a protrusion 75. When this protrusion contacts the roller 78, it urges the torch 81 toward the wire. In this manner the molten ball is formed at the end of the capillary. The opening and closing sequence of the clamp 29 is synchronized with the bonding operation in a well-known manner. See U.S. Pat. Nos. 3,448,910 and 3,358,897 for a complete discussion on this bonding technique.

Referring now to FIG. 4, the wire tensioning and feeding device 30 of FIG. 2 is shown in detail. This device provides a pneumatic means for feeding a wire through the device, that is, self-threading and also means for tensioning the wire once threaded through the device. In the prior art, capillary wire feeding devices are known, for example, see U.S. Pat. No. 3,319,859 and also see U.S. Pat. No. 3,363,818 entitled "Spool Mount For Wire Feed Device". However, unlike these prior art devices, the device of FIG. 4 provides both means for feeding and means for tensioning the wire.

The device of FIG. 4 includes a generally cylindrical housing 53 with an axially disposed bore 65. The inlet side of the bore 65 includes a countersink 66; the outlet end of bore 65 terminates in a countersink 68. One end of the housing 53 defines an annular lip 61 which cooperatively engages the annular shoulder 60 of the inlet cap 58. The generally cylindrical inlet cap 58 includes a centrally disposed bore 52 which aligns with bore 65. One end of bore 52 includes an inlet countersink 59 while the other end terminates in a tapered protrusion 57. At the other end of the housing 53 a counter-bore defines an annular shoulder 69. A disc-like end cap 67 which includes a bore which aligns with bore 65 engages this shoulder. A tapered protrusion 54 extends from surface 71 of end cap 67 into the countersink 68 when the end cap is brought in contact with shoulder 69.

When the shoulder 60 engages lip 61, a cavity 62 is defined between these two members. This cavity communicates with an inlet port 63 which is coupled to the pneumatic line 55. Similarly, when the end cap 67 engages shoulder 69, a cavity is defined between the surfaces 70 and 71 of the housing 53 and cap 67, respectively. This cavity communicates with the port 72, which port is coupled to receive fluid from the pneumatic line 56.

To feed a wire through the device of FIG. 4, a fluid such as air or nitrogen is fed into line 55. No fluid is passed through line 56. This fluid enters through port 63 and flows into cavity 62. The fluid is then directed along the exterior of taper 57 into the countersink 66, along the bore 65, and then out through the end cap 67. The fluid flow through this path causes a pressure drop within the bore 52 of the inlet cap 58, thereby drawing the wire into the countersink 59, through the bores 52 and 65 and then through the end cap 67. In this manner, wire is automatically fed through the device 30, wire clamp and capillary.

Once the wire is fed through the device, fluid flow in line 55 is terminated and flow is provided through line 56. This flow enters port 72 and then flows into the cavity defined by surfaces 70 and 71. The fluid is then directed along the taper 54 into the countersink 68, and upwardly through the bore 65. The flow of fluid in this direction provides a constant tension on a wire disposed through the device 30. (The closed wire clamp or the molten ball (after flame off) prevent the wire from being blown out of the device when tensioning is required.) The amount of this tension may be readily adjusted by adjusting the fluid flow in line 56. This is in sharp contrast to the limited tensioning control provided by prior art spring tensioning devices.

We claim:

1. A pneumatic wire feeding and tensioning device comprising:
   a body member, said member including a bore having an inlet end and an outlet end, said bore being continuous between said inlet and outlet ends;
   said body member defining a first cavity disposed adjacent to said inlet end of said bore, said cavity communicating with said bore and with a first inlet port;
   said body defining a second cavity, said second cavity adjacent to said outlet end of said bore, said second cavity communicating with said bore and with a second inlet port;
   whereby when fluid flows into said first port, through said first cavity, along said bore and through said outlet end of said bore, a wire is drawn through said bore; and when fluid flows into said second port, through said second cavity, along with said bore and through said inlet end of said bore, tension is applied to the wire disposed in said bore.

2. The device defined by claim 1 wherein said communicating between said first cavity and said bore includes a first countersink and a first tapered protrusion which directs fluid from said first cavity into said first countersink.

3. The device defined by claim 2 wherein said communication between said second cavity and said bore includes a second countersink and second protrusion which directs fluid from said second cavity into said second countersink.

* * * * *